United States Patent

Lines et al.

[11] Patent Number: 5,982,674
[45] Date of Patent: Nov. 9, 1999

[54] BI-DIRECTIONAL DATA BUS SCHEME WITH OPTIMIZED READ AND WRITE CHARACTERS

[75] Inventors: Valeria Lines, Ottawa; Cynthia Mar, Nepean, both of Canada; Xiao Luo, San Jose, Calif.; Sampei Miyamoto, Hachioji, Japan

[73] Assignees: Mosaid Technologies Incorporated, Kanata, Canada; Oki Electric Industry Co. Ltd., Tokyo, Japan

[21] Appl. No.: 09/163,341

[22] Filed: Sep. 30, 1998

[30] Foreign Application Priority Data

Sep. 30, 1997 [CA] Canada ................................. 2217375

[51] Int. Cl.$^6$ ................................ G11C 7/00; G11C 8/00
[52] U.S. Cl. ............................. 365/189.02; 365/230.02; 365/230.04
[58] Field of Search .......................... 365/239, 230.02, 365/230.03, 233, 189.02, 230.04

[56] References Cited

U.S. PATENT DOCUMENTS 5,572,691  11/1996  Koudmani ................................. 711/5
5,831,942  11/1998  Nitta et al. ........................ 365/230.03

Primary Examiner—Son Mai
Attorney, Agent, or Firm—Pascal & Associates

[57] ABSTRACT

A bi-directional global data bus scheme for use in a random access memory which optimizes the performance of the data path for read and write operations while offering a uniform read and write frequency to the external processor or controller is presented. The system makes use of a dual local data bus structure which allows the column address to change on every clock cycle since the two parallel local data paths are activated on alternate clock cycles and therefore operate at half the nominal operating frequency. For the read operation, the global data buses operate differentially at the nominal operating frequency. For the write operation, the global data buses operate at half the nominal operating frequency with each global data bus of a complementary data bus pair being dedicated to either one or the other local data paths for every other clock cycle. By implementing this scheme internally, a uniform read or write operating frequency is seen by the microprocessor, thereby simplifying its interface with the memory.

7 Claims, 9 Drawing Sheets

BI-DIRECTIONAL DATA BUS SCHEME WITH OPTIMIZED READ AND WRITE CHARACTERS

FIELD OF THE INVENTION

This invention relates to synchronous dynamic random access integrated circuit memories (SDRAMs) and in particular to a method and apparatus for operating data paths in SDRAMs.

BACKGROUND TO THE INVENTION

Asynchronous DRAMs are externally controlled by a processor using standard RAS (row address sample), CAS (column address sample), WE (write enable) and OE (output enable) signals. Operational speed of such asynchronous DRAMs is determined by the speed internal circuits require to perform operations specified by the control signals. The processor, however, must wait for the asynchronous DRAM to complete the required operation, since changing the control signals of the memory address during operation of the DRAM would interrupt its operation. As a result, the processor must waste valuable time which it could otherwise use to perform other tasks in the system, by being tied up waiting for the memory. The discrepancy in operating frequencies between that of the microprocessor (which presently can be specified to operate at up to e.g. 500 MHz), and the typically maximum operating frequency of asynchronous DRAMs (approximately 60 to 80 MHz) creates a mismatch which is becoming increasingly intolerable for many current applications.

In an attempt to increase the speed of the system, a synchronous interface can be provided to control the DRAM, the interface and DRAM together forming a synchronous DRAM (SDRAM), which is well known in the art. The use of latches for input and output data as well as address and control signals, frees the microprocessor from its waiting state, and allows it to perform other functions while the SDRAM performs its required operation under control of the system clock. In the case of a read operation, for example, after a predetermined number of clock cycles, the microprocessor can access resulting data from the output latches of the SDRAM.

Designers of data path architectures for both DRAMs and SDRAMs have tended to favor use of a bi-directional global data path, using a single global data bus per bit for both read and write operations. The bi-directional global data path has been favored in order to minimize the amount of memory chip area used for conductive data paths.

However, the read and write operations may have different speeds and different requirements on the global data bus. For example, the bus turn-around time between a read operation and a write operation may be too large for the SDRAM cycle time to accommodate. The read operation may be faster than the write operation, or vice versa. In either case, these requirements can be resolved by physically separating the global data bus into distinct read and write global data buses. This resolves bus contention problems, since the two buses operate independently and mutually exclusive of one other. However, this architecture incurs a substantial chip area penalty, due to the requirement to provide a second global data bus structure for the entire die. The penalty becomes increasingly severe for buses which carry wide data word widths.

SUMMARY OF THE INVENTION

The present invention returns to the architecture of a single global data bus which carries both read and write data. However, it receives or provides data to output circuitry which can interface an external processor, at a uniform read or write frequency.

In an embodiment of the invention, a double local data bus structure is used, interfacing the global data bus, which allows a column address to change on every system clock cycle. The double local data bus structure has two parallel local data paths which are activated on alternate clock cycles, and therefore operate at half the nominal operating frequency. For a read operation, the global data bus receives the read data from the local data bus, and carries the data differentially at the system operating frequency. For a write operation, the global data bus operates at half the nominal operating frequency, with each global data bus line of the data bus pair carrying alternate words to be written in a single ended rather than differential mode, and being dedicated to either one or the other local data paths for every other clock cycle.

The processor will therefore see a uniform read or write operating frequency, thereby simplifying its interface with the SDRAM. Yet the amount of chip area needed for the global data bus is minimized, since only a single bi-directional global databus is required. The global data bus is used in a manner toggling between single ended databus lines at half the system frequency for a write operation, and in a differential manner at the system frequency for a read operation.

In an embodiment of the invention, a method of operating data paths in a semiconductor device having a global data path and a local data path comprising: coupling data received from a data input node in sequence alternately to each of a global data bus and its complement at one half of a system clock frequency, wherein each successive bit of data received at the data input node is alternately channeled to one of the global data bus and its complement on a per-bit basis; alternately driving data from each of the global data bus and its complement onto a respective complementary local data bus pair of a plurality of local data bus pairs differentially at one half of the system clock frequency, and writing the data from the respective complementary local data bus pair to selected memory cells.

In accordance with another embodiment, a method for inputting and outputting data to and from a semiconductor storage device having data storage cells, a bi-directional complementary global data bus pair and at least two complementary local data bus pairs, comprising the following steps: receiving input data from a data input node at a full system clock frequency; coupling the input data on alternate cycles of a system clock to each global data bus of the bi-directional complementary global data bus pair in alternating succession; selectively converting the input data from one global data bus of the bi-directional complementary global data bus pair into differential input data to be applied to a corresponding pair of the at least two complementary local data bus pairs during one cycle of the system clock; enabling a first group of local access devices to transfer the input data from one of the local data bus pairs to a first selected storage location; selectively converting the input data from the other global data bus of the bi-directional complementary global data bus pair into differential input data to be applied to a corresponding other of the at least two complementary local data bus pairs during a subsequent cycle of the system clock; enabling a second group of local access devices to transfer the input data from the other of the at least two local complementary local data bus pairs to a second selected storage location; whereby input data accepted into the semiconductor device at the system clock frequency is alternately channeled into two separate complementary local data bus pairs via the bi-directional complementary global data bus pair operating at one half the system clock frequency in a single ended manner.

In accordance with another embodiment, a method for operating a bi-directional global data path in a synchronous random access memory having dual local data paths for accessing data on alternate cycles of a system clock comprising the following steps: writing data to the memory by operating global data buses of the bi-directional global data path in a single ended manner with separate data on each global data bus of a complementary global data bus pair being channeled to either one or the other of the dual local data paths on alternate cycles of the system clock; reading data from the memory by operating global data buses of the bi-directional global data path in a differential manner with differentially sensed and amplified local data being applied to the global data buses on every cycle of the system clock.

BRIEF DESCRIPTION OF THE DRAWINGS

A better understanding of the invention will be obtained by a consideration of the detailed description below, in conjunction with the following drawings, in which.

DETAILED DESCRIPTION OF EMBODIMENTS OF THE INVENTION

Figure 1:
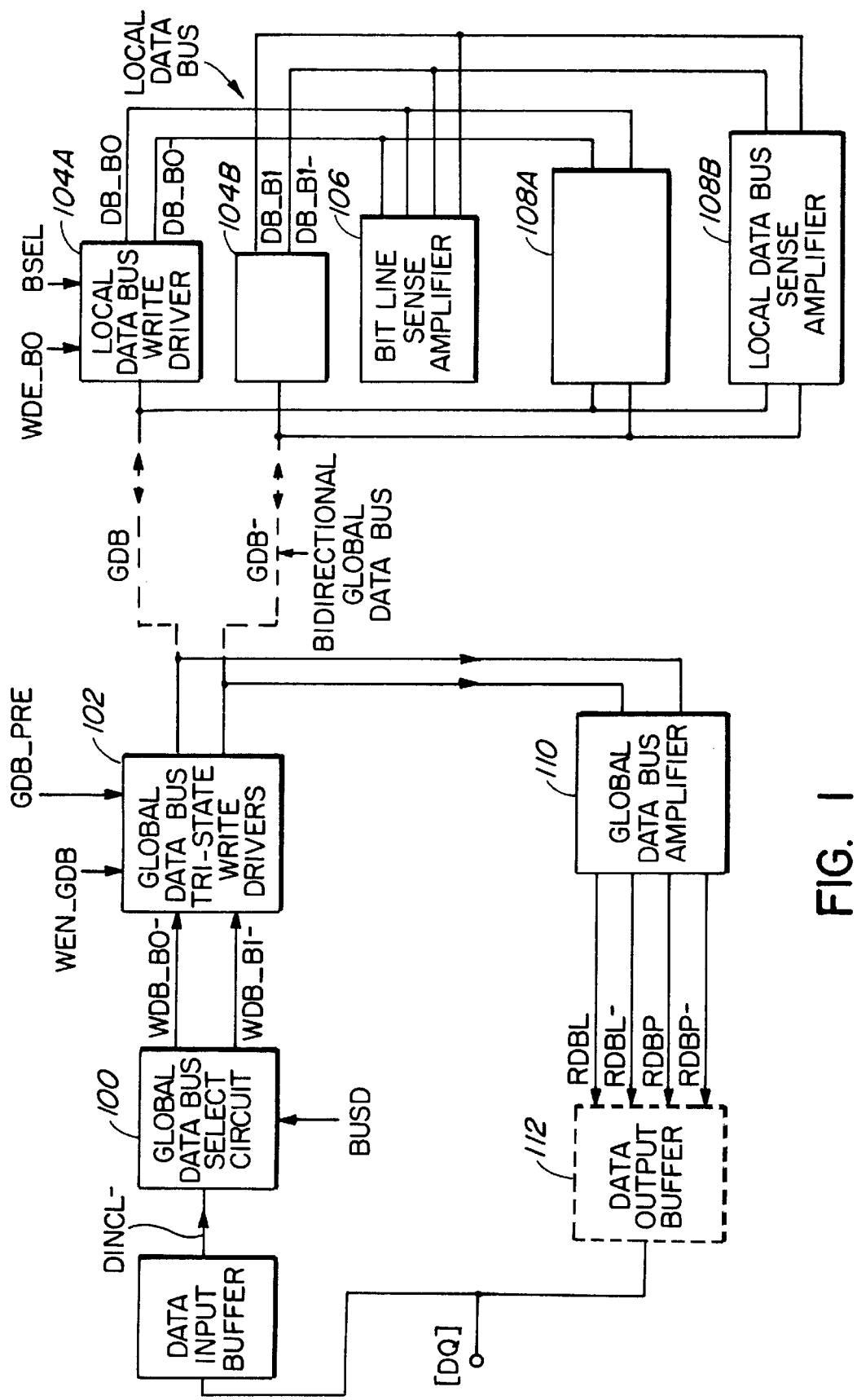
FIG. 1 is a block diagram of parts of an SDRAM which includes an embodiment of the invention.
Figure 2:
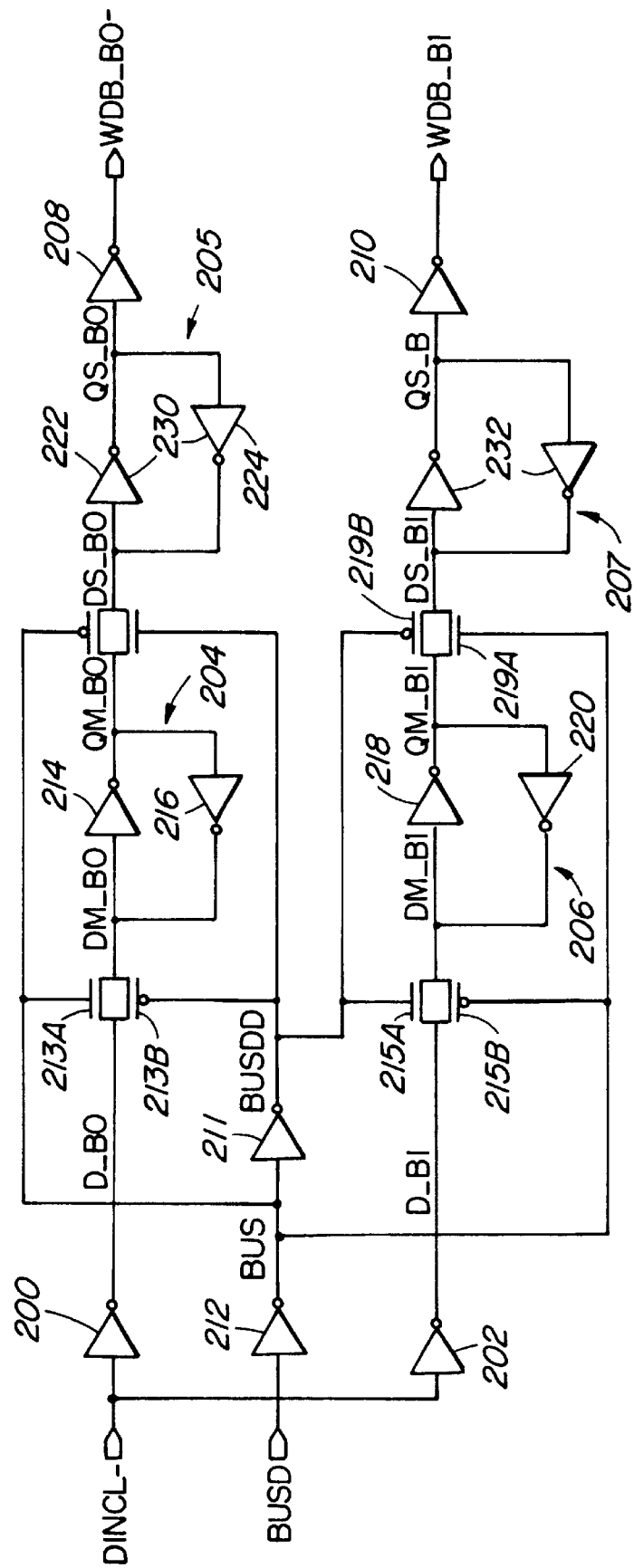
FIG. 2 is a schematic diagram of a global write data bus select circuit.
Figure 8:
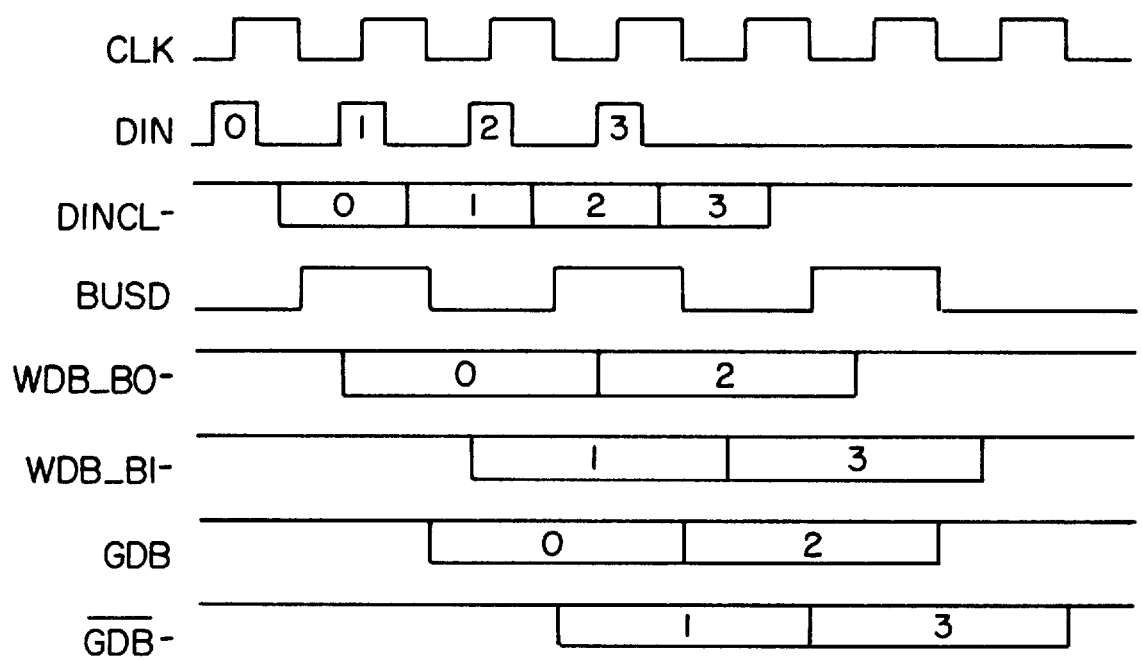
FIG. 8 is a data path timing diagram for the write operation.

Turning first to FIGS. 1 and 8, and considering the single bit case, in a write operation, data to be written is received from off-chip via an input buffer and is latched to produce a single ended mode input line DINCL-, and is applied to a global write data bus select circuit 100. A clock signal BUSD is also applied to select circuit 100 which operates at one-half of the system clock frequency. The select circuit 100 applies each alternate word to respective single ended write lines WDB_B0- and WDB_B1-. A schematic diagram of an embodiment of select circuit 100 is illustrated in FIG. 2, and will be described in more detail later.

Figure 3:
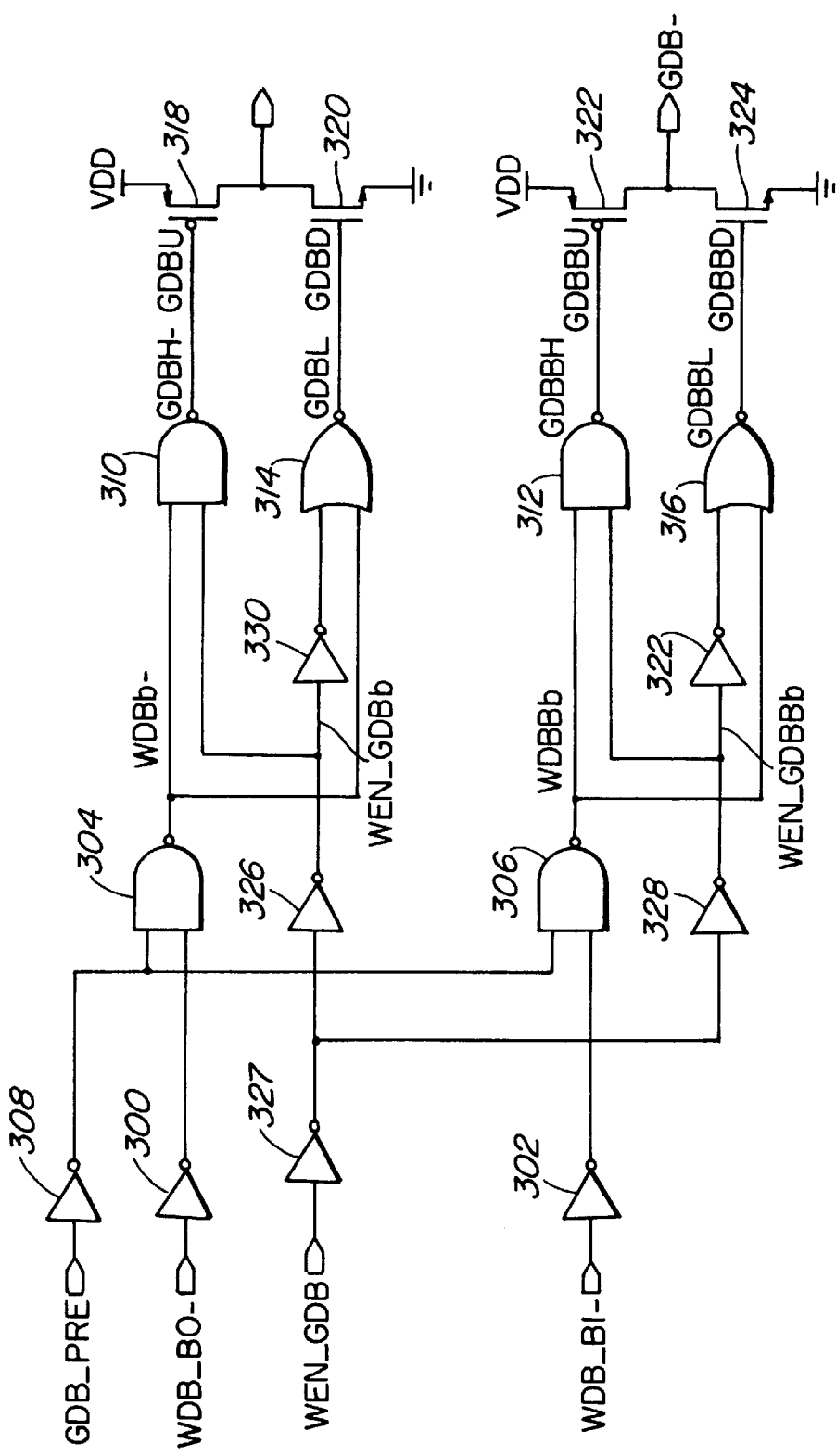
FIG. 3 is a schematic diagram of a global data bus write driver.

The data signals carried on lines WDB_B0- and WDB_B1- are applied to a global data bus tri-state write drivers circuit 102, which is enabled by global data bus write driver enable signals WEN_GDB and global data bus precharge signals GDB_PRE. Drivers circuit 102 drive the global data bus pair comprised of lines GDB and GDB-. A schematic diagram of an embodiment of global data bus write driver circuit 102 is illustrated in FIG. 3, and will be described in more detail later.

It should be noted that a bit of each alternate input data word is thus separately carried by alternate global data lines GDB or GDB- at one-half of the system frequency. The global data lines are separately driven as single ended lines carrying two streams of data, as distinguished from mutually differential lines carrying a single stream of data in complementary form.

The write data carried by each of the global data bus lines GDB and GDB- is applied to different local data bus write drivers 104A and 104B. The drivers 104A and 104B are enabled by block select signal BSEL and by respective driver enable signals WDE_B0 and WDE_B1. The local write drivers convert the single ended data carried by the global data bus lines GDB and GDB- to differential signals, which are applied to respective local data bus pairs DB_B0, DB_B0-, and DB_B1, DB_B1-.

Figure 4:
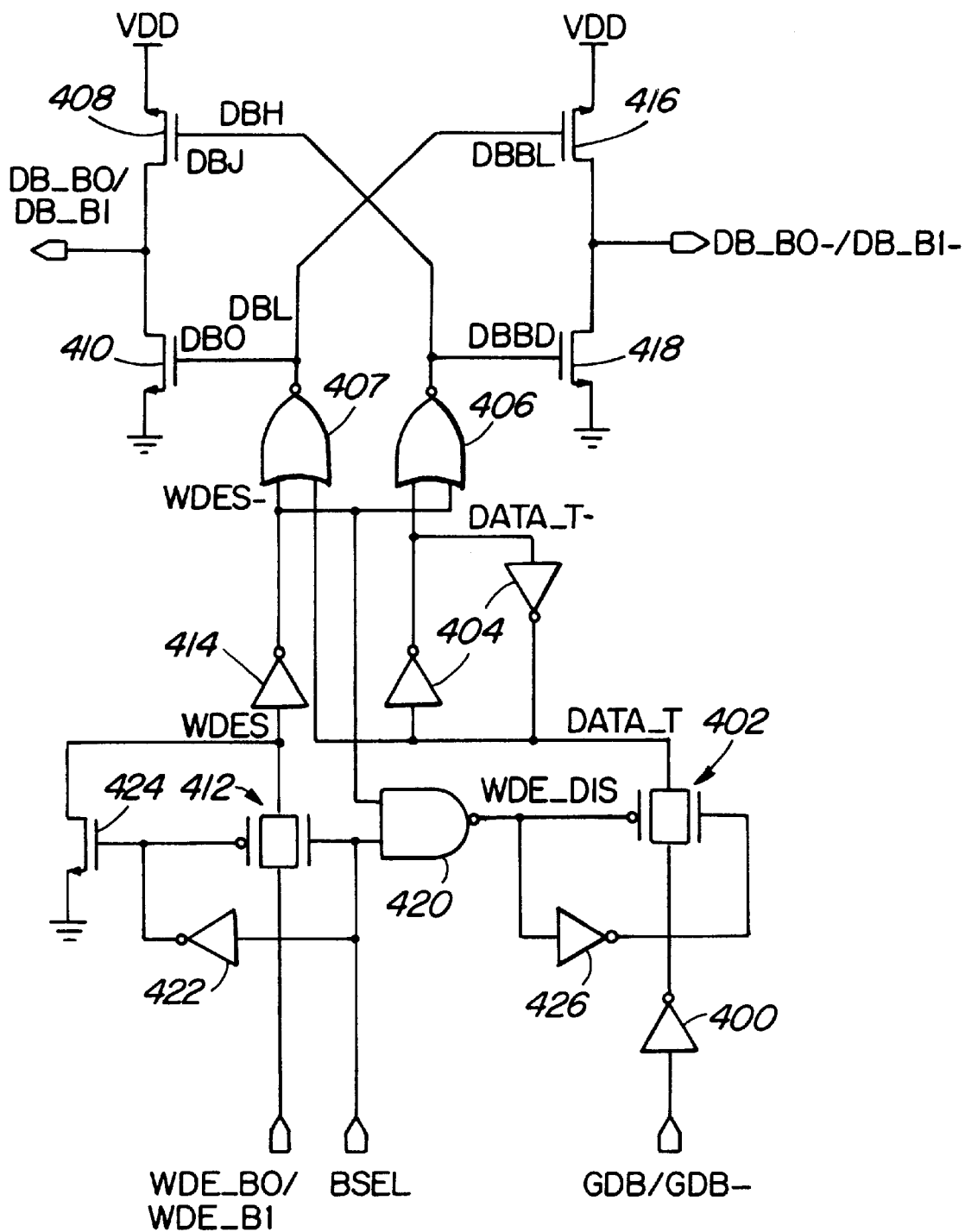
FIG. 4 is a schematic diagram of a local data bus write driver.

A schematic diagram of an embodiment of driver circuits 104A and 104B is illustrated in FIG. 4, and will be described in more detail later.

Figure 5:
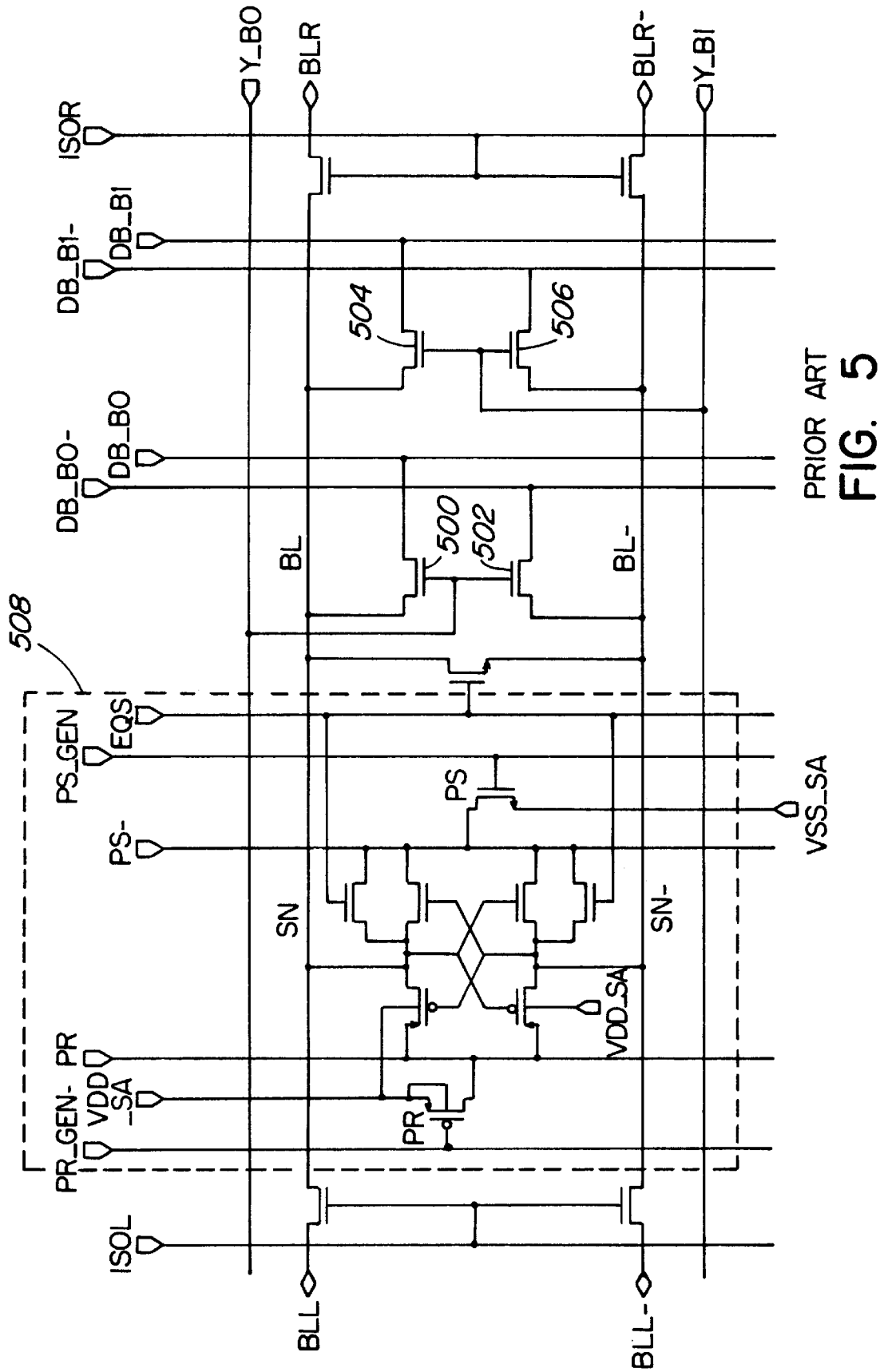
FIG. 5 is a schematic diagram of a column access and sense amplifier used for both read and write operations, which is a circuit used in the prior art.

The respective two local data bus pairs DB_B0, DB_B0- and DB_B1, DB_B1- are accessed in turn by a local column (or bit line) select signal Y_B0 or Y_B1 for writing the data carried by the local data bus pairs into a memory cell selected by a wordline (not shown). A schematic diagram of an embodiment of sense amplifier 106 is illustrated in FIG. 5, and will be described in more detail later. Sense amplifier 106 is described in U.S. Pat. No. 5,416,743 to Allan et al, and is incorporated herein by reference.

Thus in operation, successive data words carried per bit by the DINCL- single ended input line are coupled in an alternating manner to single ended write data lines WDB_B0- and WDB_B1-, at a frequency specified by the BUSD signal, preferably one half of the system clock frequency. The write data lines are then applied to global data bus tri-state write drivers at the same rate, when enabled by signals WEN_GDB and GDB_PRE, to drive global data bus lines GDB and GDB- in a single ended manner with the signals carried by WDB_B0- and WDB_B1-.

After passing down the global data bus, the signals are received by local data bus write drivers 104A and 104B, where the single ended signals are converted to differential signals and are applied to respective local data buses DB_0, DB_B0- and DB_B1 and DB_B1-. These signals are then written to the SDRAM storage cells.

In a read operation, a data bit stored in a selected storage cell of the SDRAM is sensed by the sense amplifier 106, and is differentially applied to either of the local data bus pairs DB_B0, DB_B0- or DB_B1, DB_B1-, alternating on every clock cycle. The signals thus carried by the local data buses are then received by corresponding local data bus sense amplifiers 108A and 108B at one-half of the system frequency, and are applied in alternation, at the system frequency, to global data bus lines GDB, GDB-, in differential form.

After being carried by the global data bus, the differential data is received by global data bus sense amplifier 110, which further amplifies the differential data and latches it, producing the output signals RDBL, RDBL- and RDBP, RDBP-, for application to a data output buffer 112 which will typically couple these signals to an output pin of the SDRAM chip.

Thus it may be seen that the global bus lines GDB and GDB- are used to carry in single ended form in one direction, successive words of write data at one half of the system frequency, and are used to carry in differential form in the other direction, successive words of read data at the system frequency. The write data is input to the memory at the system frequency and the read data is output from the memory at the system frequency. Thus while only a single bi-directional global data bus per bit is used, the chip can interface a processor at the system frequency.

In order to ensure that the read and write data do not interfere, a WRITE CL__BK- (write block) signal is applied to the local data bus sense amplifiers 108A and 108B to inhibit application of data to the global bus during a write operation, and similarly the global data bus tri-state write drivers are disabled by WEN__GDB falling prior to a read operation.

Turning now to the detailed schematic diagrams, FIG. 2 illustrates the global write data bus select circuit 100. The input data line DINCL- splits into two lines, the data carried thereby passing through respective inverters 200 and 202 into flip-flops 204 and 206 and 205 and 207 connected in master/slave configuration, then passing through inverters 208 and 210 to respective single ended write data lines WDB__B0- and WDB__B1-.

Each of the flip-flops is comprised of a pair of cross-coupled inverters 214 and 216 in flip-flop 204, and 218 and 220 in flip-flop 206. The input of inverter 214 is coupled to the output of inverter 200 via a full CMOS transfer gate comprising of NMOS FET 213A and PMOS FET 213B having their sources and drains coupled together in parallel in a well known manner. The input of inverter 218 is similarly coupled to the output of inverter 202 via another CMOS transfer gate consisting of NMOS FET 215A and PMOS FET 215B having their sources and drains coupled together in parallel.

The second stage flip-flops 205, 207 are similarly cross coupled as are 204 and 206. They receive inputs via two CMOS transfer gates 217A, 217B for 205 and 219A, 219B for 207. The two flip-flop stages and their corresponding transfer gates act in a master/slave configuration, effectively providing a two-stage pipeline for each single ended write data line WDB__B0- and WDB__B1-.

A clock signal BUSD is applied via inverter 212 to the gate of NMOS FETs 213A, 219A and to the gate of PMOS FETs 217B, 215B and from the output of inverter 212 and via inverter 211 to the gates of PMOS FETs 213B, 219B and the gates of NMOS FETs 215A, 217A. The clock signal BUSD oscillates at half the system frequency. Thus every successive half cycle of the BUSD clock signal will alternately be logic high followed by logic low, causing the transfer gates to be alternately conductive. For example, when BUSD is high, 217B, 217A and 215A, 215B are conductive, whereas when BUSD is low, 213A, 213B and 219A, 219B are conductive. The circuit thus operates as a master/slave selection switch, with the clock BUSD selecting which branch of the circuit should carry the alternate data bit. As a result, data appearing on line DINCL- at the full system frequency is driven alternately onto WDB__B0- or WDB__B1- at half the system frequency.

In summary, the input data to be written is carried on single ended line DINCL- and is split into two branches WDB__B0- and WDB__B1-. Each branch is comprised of two series connected flip-flops, clocked by the BUSD clock signal. This clock signal oscillates at half the system frequency. As input data appears at the full system frequency, the BUSD signal clocks this data into each branch at half the system frequency. The BUSD signal thus acts as a switch selection signal, alternately switching the path of the input data onto one or the other of the two branches. As a result, data is alternately driven on to either of the WDB__B0- or WDB__B1- lines at half the system frequency.

The WDB__B0- and WDB__B1- lines are input lines to the global data bus tri-state write drivers, as shown in FIG. 3. The input lines are respectively coupled through inverters 300 and 302 to first inputs of NAND gates 304 and 306. A global data bus precharge enable signal GDB__PRE is applied via inverter 308 to second inputs of NAND gates 304 and 306. The output signals of NAND gates 304 and 306 are respectively coupled to inputs of NAND gates 310 and 312 as well as to inputs of NOR gates 314 and 316.

The output of NAND gate 310 is coupled to the gate of a PMOS FET 318, and the output of NOR gate 314 is coupled to the gate of NMOS FET 320. The source-drain circuits of FETs 318 and 320 are connected in series between a voltage supply Vcc and ground. A global data bus line GDB is connected to the junction of FETs 322 and 324.

The output of NAND gate 312 is coupled to the gate of a PMOS FET 322, and the output of NOR gate 316 is coupled to the gate of NMOS FET 324. The source-drain circuits of FETs 322 and 324 are connected in series between the voltage supply Vcc and ground. A global data bus line GDB- is connected to the junction of FETs 318 and 320.

A write enable control signal WEN__GDB is applied to the inputs of inverters 326 and 328 via inverter 327, the outputs of which are respectively coupled to another input of NAND gate 310 and NAND gate 312. The output of inverter 326 is coupled via inverter 330 to another input of NOR gate 314, and the output of inverter 328 is coupled via inverter 332 to another input of NOR gate 316.

In operation, the signals to be written appear alternately on the lines WDB__B0- and WDB__B1-. With the GDB__PRE control signal at low logic level and WEN__GDB at high logic level, the WDB__B0- and WDB__B1- signals pass alternately through NAND gates 304 and 306 to NAND gates 310, 312 as well as NOR gates 314 and 316, to drive the gates of NMOS FETs 320 and 324 and PMOS FETs 318 and 322. The bus lines GDB and GDB- are thus alternately driven between the logic states of the data signals and ground, i.e. a single ended mode of operation, each at one-half of the system frequency.

More specifically, and with reference to FIG. 8, both the WDB__B0- and WDB__B1- signals start out precharged high. As the first bit of data appears on the input buffer, bit 0 on a first system clock cycle rising edge, after a short delay, the bit 0 is latched and appears on the DINCL- line. The BUSD clock signal, oscillating at one-half of the system clock frequency, rises causing the WDB__B0- signal to become logic low. This logic low is inverted by inverter 300 to provide two high inputs to NAND gate 304, thereby causing a low output, which in turn is fed as an input to NAND gate 310 and to NOR gate 314. Since WEN__GDB is high, one of the inputs to NOR gate 314 is set logic low. The output of NAND gate 304 thus provides a second low input to NOR gate 314, thereby causing it to provide a high output. This high output causes NMOS pull down FET 320 to conduct, thereby pulling the GDB line low. In the meantime, the PMOS pull up FET 318 is non-conductive due to its high input.

Similarly, the WDB__B1- branch will pass on data to the GDB- line on the following transition of the BUSD signal. As a second system clock inputs and latches the second bit of incoming data, bit1, the BUSD signal changes from high to low, thus causing the WDB__B1 branch to function similarly to the WDB__B0- branch as described above. In this alternating manner, on every clock cycle the BUSD signal changes logic state and switches the path of the incoming data from WDB__B0- to GDB and WDB__B1- to GDB- respectively.

At the end of the write operation the PMOS pull-up FETs 318 and 322 are briefly enabled by the GDB_PRE control signal passing through NAND gates 304 and 310, and 306 and 312 and being coupled to their gates, to cause the GDB and GDB- bus lines to receive the nominal voltage Vcc, and thus become precharged.

After the GDB and GDB- bus lines have been precharged, the signal WEN_GDB should fall, ensuring that the write drivers are tri-stated after the write operation, thus allowing the global data buses to be used to carry read data without interference.

The global data buses GDB and GDB- are used to carry data significant distances along the memory chip, for storage in the memory cells of the SDRAM. The signals carried by single ended bus lines GDB and GDB- are driven onto separate differentially operated local data buses DB_B0, DB_B0- and DB_B1, DB_B1-. This local driving function is carried out by local data bus write drivers 104A and 104B. There are two local write drivers per bit for each B0 and B1 local data paths. A circuit of a write driver is shown in FIG. 4, of which all are similar.

Data from the GDB line for the B0 path or GDB- line for the B1 path is applied via inverter 400 to the sources of CMOS FET transfer gate transistor pair 402 which have their sources and drains connected in parallel. The drains of FET pair 402 are coupled to a latch comprised of a pair of inverters 404 connected in back to back configuration. The output of the latch is coupled to an input of a NOR gate 406 the output of which is connected to the gate of a an NMOS FET 408 of an NMOS pair having their source-drain circuits connected in series between a voltage source Vdd and ground. The other NMOS FET 410, has its source connected to ground. The junction of the FETs 408 and 410 provides the local data bus output DB_B0 corresponding to the GDB input and DB_B1 corresponding to the GDB- input. The drains of FET pair 402 is also connected to an input of a NOR gate 407.

A write driver enable signal WDE_B0 for the GDB input or WDE_B1 for the GDB- input is applied to the sources of another CMOS FET pair, which also have their drains connected together. The drains are also coupled through inverter 414 to another input of NOR gate 407 as well as to another input of NOR gate 406.

The output of NOR gate 407 is coupled to the gate of an NMOS FET 416 which has its source-drain circuit connected in series with the source-drain circuit of another NMOS FET 418, between a voltage source Vdd and ground. The output of NOR gate 407 is also connected to the gate of FET 410, and the output of NOR gate 406 is also connected to the gate of FET 418. The complementary local data bus line DB_B0 corresponding to the GDB input or DB_B1 corresponding to the GDB- input is connected to the junction of FETs 416 and 418.

A block selection signal BSEL is coupled to the gate of the NMOS FET of the pair 412, to an input of a NAND gate 420, and via an inverter 422 to the gate of the PMOS FET of the pair 412 as well as the gate of an NMOS FET 424. The source of FET 424 is connected to ground, and the drain of FET 424 is connected to the drains of the FET pair 412.

The output of NAND gate 420 is coupled to the gate of the PMOS FET of the pair 402, and through an inverter 426 to the gate of the NMOS FET of the pair 402. The output of inverter 414 is coupled to the other input of NAND gate 420.

In operation, prior to a write operation, the block selection signal BSEL is low, as well as the write driver enable signals WDE_B0 and WDE_B1. Upon the BSEL signal going high, the gates of the FETs 402 cause those FETs to conduct, allowing incoming data from the GDB or GDB- global data bus to pass through and become latched by the latch comprised of inverters 404. The latching is necessary to allow the GDB/GDB- lines to be precharged as soon as possible if a read is requested following a write operation. After a predetermined delay, the WDE_B0 or WDE_B1 signal rises, which causes the FETs 402 to become non-conductive, isolating the input from the latch. The signal rising also passes through FETs 412 to NOR gates 406 and 407, allowing the data latch 404 in the latch to pass to the gates of FETs 408 and 416. The gates of FETs 410 and 418 are driven with the logic level to be applied to the respective opposite line, causing them to be oppositely conductive to FETs 408 and 416. Thus lines DB_B0 or DB_B1 and DB_B0- or DB_B1- are driven differentially to nominally Vdd or ground due to conduction of FETs 408 and 416, or 410 and 418. This occurs at half the system frequency.

Thus the single ended data carried separately on each line of the global data bus is transferred to a pair of differential local data buses DB_B0, DB_B0- and DB_B1, DB_B1- each one of which carries data at half the system frequency. The data carried by the local data buses are applied to a selected memory cell location as described in the aforenoted U.S. patent. A schematic diagram of the preferred sense amplifier and columns access circuitry is shown in FIG. 5.

The pairs of local data buses are coupled to bit lines (or columns) BL and BL- via the source-drain circuits of FETs 500, 502 for data bus pair DB_B0, DB_B0-, and via the source drain circuits of FETs 504, 506 for data bus pair DB_B1, DB_B1-. FETs 500 and 502 are enabled by their gates being coupled to enable line Y_B0, and FETs 504 and 506 are enabled by their gates being coupled to enable line Y_B1. Thus a control signal applied to the Y_B0 line causes FETs 500 and 502 to conduct, transferring data carried by local data bus pair DB_B0, DB_B0- to the bit line pair BL and BL-. From here the data is written to a selected bit storage cell (not shown).

Similarly, a control signal applied to the Y_B1 line causes FETs 504 and 506 to conduct, transferring data carried by local data bus pair DB_B1, DB_B1- to the bit line pair BL and BL-. From here the data is written to a selected bit storage cell (not shown).

The control signals on the Y_B0 and Y_B1 lines are driven every alternate cycle, causing the sense amplifier to write data alternately from each of the local data buses once each system clock cycle.

This completes the write cycle.

Data is read by the local sense amplifier being controlled to read data stored in a selected local bit storage cell in a well known manner, at the system clock rate. With reference to FIG. 1 again, on a per bit basis, the read data is applied alternately to each of the local data buses DB_B0, DB_B0- and DB_B1, DB_B1- in a manner reciprocal to the write operation, i.e. control signals are applied to the lines Y_B0 and Y_B1 alternately every second system clock cycle. The read data is thus transferred to and is carried by the local data bus lines in differential form. Local data bus sense amplifiers 108A and 108B, each coupled to a respective local data bus, sense the read data and apply it differentially and alternately to global data bus lines GDB and GDB- in single ended form, at one-half of the system clock frequency.

Figure 6:
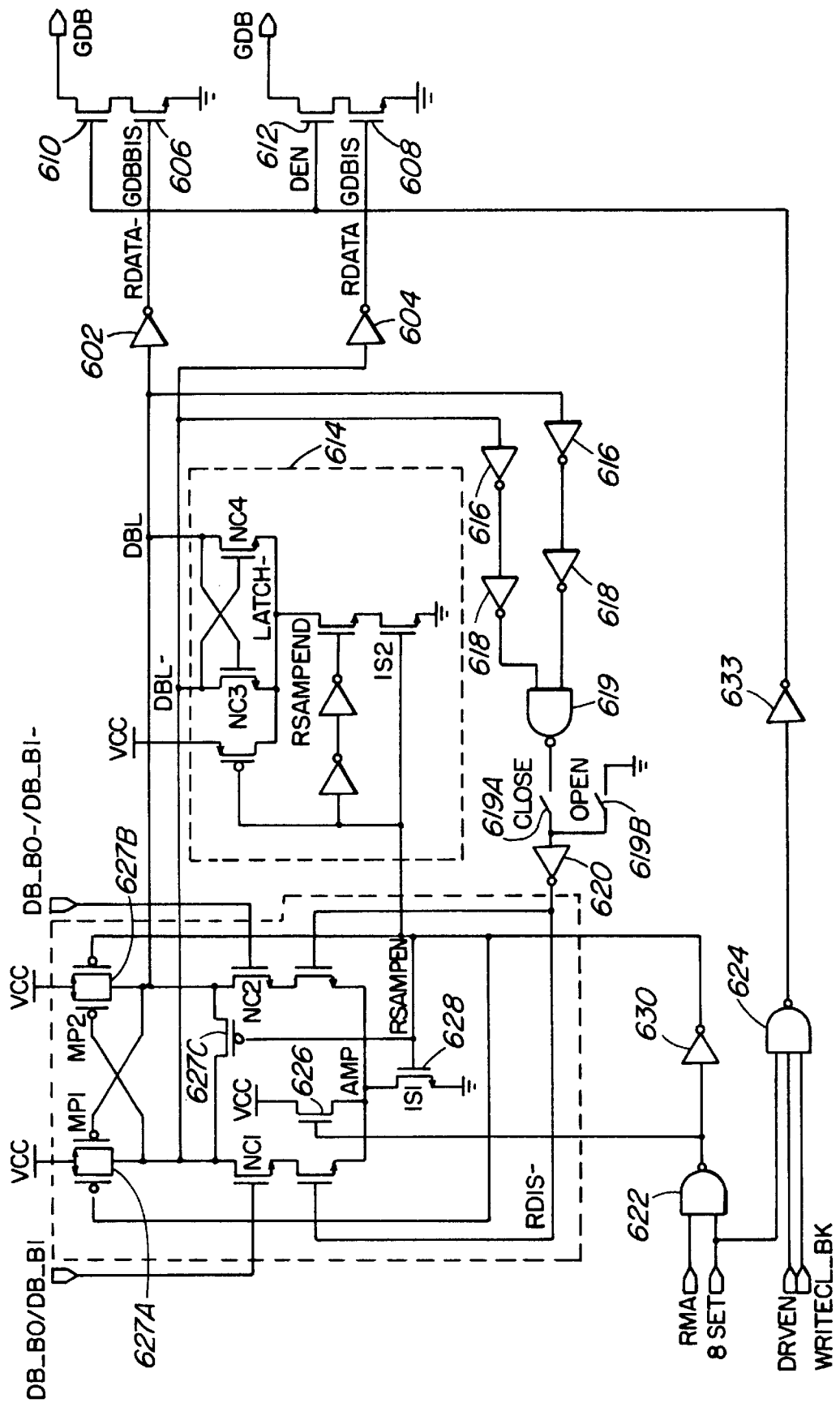
FIG. 6 is a schematic diagram of a read sense amplifier.
Figure 9:
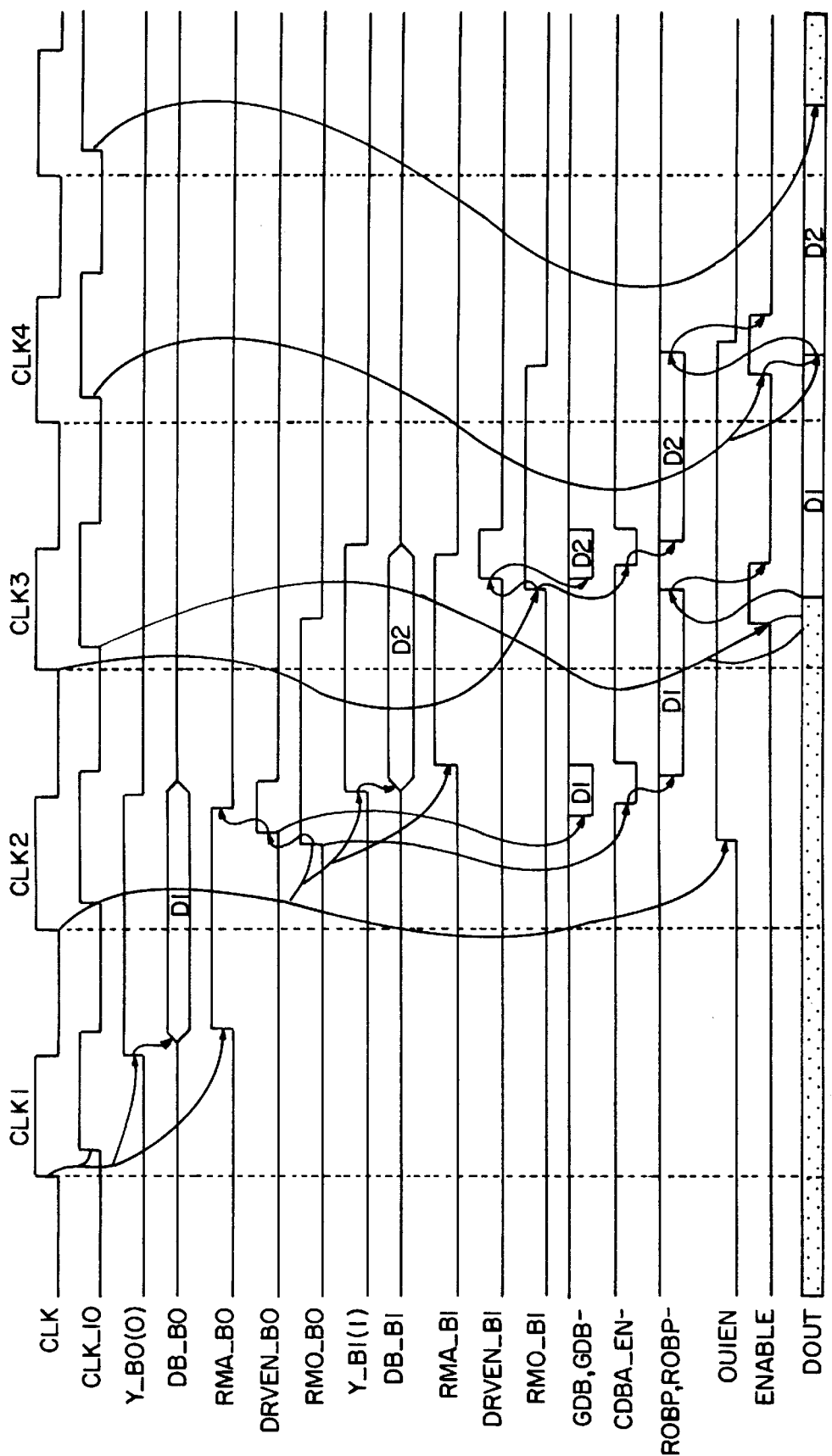
FIG. 9 is a data path timing diagram for the read operation.

FIG. 6 illustrates a schematic diagram of a local data bus sense amplifier 108A, 108B, and FIG. 9 illustrates a signal timing diagram for the read operation. Data from the local data bus lines DB_B0, DB_B0- and DB_B1, DB_B1- are applied to inputs of differential sense amplifier 600. The outputs of sense amplifier 600 are coupled via inverters 602 and 604 to the gates of respective NMOS FETs 606 and 608. The source-drain circuits of FETs 606 and 608 are connected in series with the source-drain circuits of FETs 610 and 612 respectively, the series circuits being connected respectively between the bi-directional global data bus lines GDB, GDB- and ground. This illustrates the transition between the local and global data paths on a per bit basis.

A latch 614 is also connected to the lines inputting to the inverters 602, 604 which carry the sensed data. Thus once data has been sensed by the sense amplifier 600, it is latched into the latch 614.

A feedback path is also coupled between the lines carrying the latched data and the sense amplifier 600, to disable the sense function once data has been latched. The preferred form of feedback path is comprised of two inverters 616 and 618 connected in series, the inputs of which are coupled to the respective lines carrying the sensed data, and the outputs of which are connected to respective inputs of NAND gate 619. The output of NAND gate 619 is coupled to the input of inverter 620 through a metal mask option 619A, 619B. The output of inverter 620 is coupled to the gates of a pair of FETs in the sense amplifier which can disable its differential sense capability.

Control signals for the local data bus sense amplifier are comprised of an RMA signal, and a Bsel signal, both applied to respective inputs of NAND gate 622, and DRVEN and WRITECL_BK- signals, which are applied to respective inputs of a NAND gate 624. The Bsel signal is applied to another input of NAND gate 624. The output of NAND gate 622 is coupled to the gate of an NMOS FET 626, which has its source-drain circuit connected in series with the source-drain circuit of another NMOS FET 628, between a voltage source Vcc and ground. The junction of FETs 626 and 628 is a node which establishes precharge voltage to the sense amplifier 600. Thus when FET 626 is enabled, the aforenoted node is raised to nominal Vcc, and when FET 628 is enabled that node is dropped to nominal ground.

The output of NAND gate 622 is also coupled via inverter 630 to the gate of FET 628, and to the gates of PMOS FETs 627A, 627B and 627C which precharge and equalize the sense amplifier outputs prior to sensing in a well known manner.

The output of NAND gate 624 is coupled via inverter 633 to the gates of FETs 610 and 612.

In operation, with the RMA signal low, precharge is performed by enabling of NMOS FET 626 from the output signal of NAND gate 622, as well as PMOS FETs 627A, 627B and 627C, and inhibition of FET 628 from the output signal of NAND gate 622 inverted by inverter 630. Sensing begins with the RMA signal rising and a block selected. The DRVEN signal then rises, FETs 610 and 612 are enabled, allowing data latched by latch 614 to be driven to the global data bus lines GDB and GDB-.

When the DRVEN signal falls, the FETs 610 and 612 are disabled, disconnecting the current sources 610, 606 and 612, 608 from the GDB and GDB- lines and allowing GDB, GDB- to be precharged to Vcc via other circuits in preparation for the next read operation.

The WRITECL_BK- signal is derived from an external command decoder, and passes through NAND gate 624 and inverter 633 to the gates of FETs 610 and 612. This signal should be applied as soon as possible once a write operation has been requested, since by inhibiting FETs 610 and 612 from conducting, it disconnects the read circuits (i.e. the local data bus sense amplifier) and thus avoids the read operation from affecting the write signal which is to be subsequently carried by the bi-directional global data bus.

Since a write operation can interrupt a read operation in SDRAMS, bus contention must be avoided. By disabling the current sources as described above, the local data bus sense amplifiers are also disabled allowing the write operation to use the local and global data buses. The control of the local data bus sense amplifiers by the WRITECL_BK signal is important to the present invention, since it avoids contention from the reading circuits point of view when an interrupting write operation is to begin.

It will be understood by persons skilled in the art that other configurations of a local data bus sense amplifier can be used without compromising the principles of the present invention.

Figure 7:
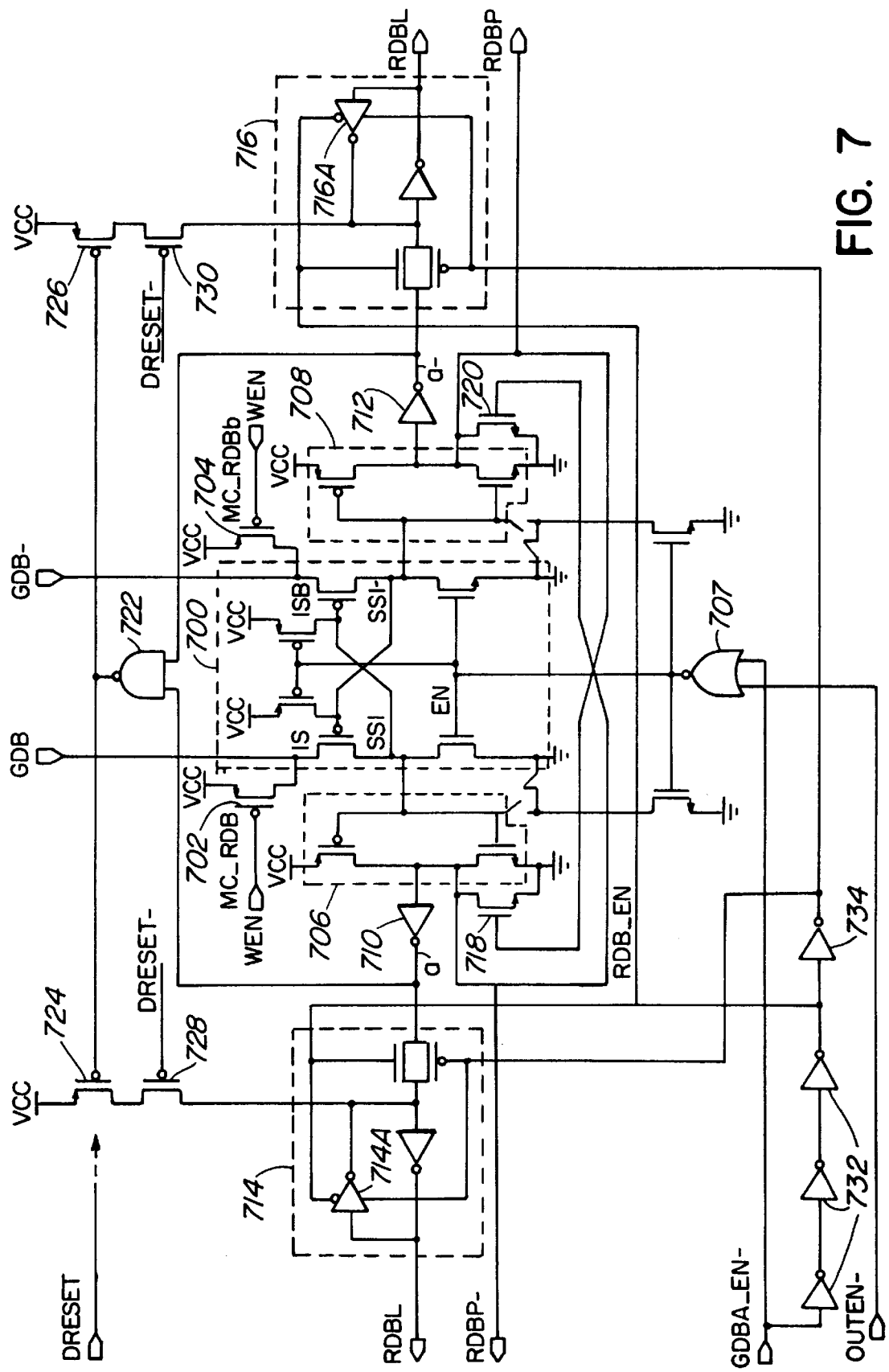
FIG. 7 is a schematic diagram of a global data bus sense amplifier used for read operations.

The read data provided by the local data bus sense amplifier and carried in differential form on bi-directional global data bus GDB, GDB- is carried along the chip, to a global data bus amplifier 110, which further amplifies the signal in differential form to compensate for the long global data bus lines which can cause signal degradation, for provision to a data output buffer for delivery to an external pin of the chip. A global data bus amplifier is illustrated in FIG. 7.

The global data bus amplifier is comprised of a current sense amplifier 700, to which voltage Vcc is applied via the source-drain circuits of PMOS FETs 702 and 704 in order to precharge the global data bus lines GDB and GDB- both to Vcc. The outputs of the sense amplifier 700 are coupled to inverters 706 and 708 respectively. A control signal WEN is coupled to the gates of FETs 702 and 704.

A global data bus enable control signal GDBA_EN- is coupled to an input of NOR gate 707, which has its output connected to the sense amplifier enable input. An output enable control signal is coupled to another input of the NOR gate 707.

During a read operation, when the WEN control signal is at low logic level, FETs 702 and 704 are enabled, and a bias current is passed from Vcc into the sense amplifier. The OUTEN- and GDBA_EN- signals are brought low to enable the sense amplifier. As described earlier, the local data bus sense amplifiers sense and drive the local data onto the data bus lines GDB and GDB-. It should be noted that different currents will flow via GDB and GDB-. The global data bus sense amplifier then converts this current difference into a voltage difference which appears at the outputs of the sense amplifier 700, i.e. at the inputs to inverters 706 and 708. The inverters 706 and 708 amplify this difference.

The amplified signals are respectively passed through inverters 710 and 712, and are latched in latches 714 and 716. The outputs of inverters 706 and 708 represent the first outputs of the global data bus sense amplifiers, and are provided at output nodes RDBP- and RDBP. Additional NMOS FETs 718 and 720 have their source-drain circuits connected across these outputs RDBP- and RDBP, with their gates cross-connected, to temporarily store the data and thus ensure that it does not change prior to the output latches 714 and 716 of the sense amplifier being activated.

The outputs of inverters 710 and 712 are the inputs to the sense amplifier output latches 714 and 716, and these nodes are coupled to respective inputs of NAND gate 722. The output of NAND gate 722 is coupled to the gates of FETs 724, 726 each of a pair of series connected PMOS FETs 724 respectively connected between each of the latches 714, 716 and voltage source Vcc. A control signal DRSET- is applied to the gates of the other FETs 728, 730 of each pair 724, 728 and 726, 730 to control operation of FETs 728, 730.

The GDBA_EN- signal is also applied to the input of a delay circuit, e.g. comprised of a series of an odd number of inverters 732, followed by an inverter 734. The output of the inverter 734 and of the delay circuit are applied to the controlling inputs of inverter 714A of latch 714 and 716A of latch 716.

As long as the voltages at the outputs of inverters 710 and 712 are different, FETs 724 and 726 remain off. After a predetermined delay from the falling of the GDBA_EN- signal, caused by the delay circuit, the output latches 714 and 716 are enabled, and the second outputs RDBL-, RDBL of the global data bus sense amplifiers are latched and ready to proceed to the output buffers.

The RDBL- and RDBL signals extend and overlap with the RDBP- and RDBP signals and are incorporated to support a CAS latency of 3, and to allow for data to come from the two local data bus sources, i.e. DB_B0, DB_B0- and DB_B1, DB_B1-. Of course other latencies could be implemented.

When the control signal DRESET- falls, the latch is reset and the sense amplifier returns to its precharge mode.

When a write operation is to commence, a signal OUTEN- is applied, in a manner similar to the local data bus read sense amplifier. This is applied to NOR gate 707 which quickly disables the global sense amplifiers, to avoid bus contention between read and write operations.

The logic level of the signal global sense amplifier enable signal GDBA_EN- is also changed in response to the write command, which maintains the global sense amplifiers disabled. However, disabling the global sense amplifiers initially using the GDBA_EN- command would take too long, and read and write data would end up colliding on the global data bus. It is for this reason that a fast command OUTEN- is used for disabling the global sense amplifiers.

With reference to the timing diagram for write operations illustrated in FIG. 8, data DIN is received by the system external to the design shown, typically an input buffer, as the numbered bits 0, 1, 2, 3. After synchronization with the system clock pulses CLK, the data is latched and output as DINCL-. The BUSD signal represents the clock signal oscillating at one-half of the system frequency, which is applied to the global data bus select circuit as described above.

With the application of the BUSD signal, the DINCL- data is channeled onto the respective write data lines WDB_B0- (e.g. words 0, 2) and WDB_B1- (e.g. words 1, 3), at one-half of the system clock frequency, (FIGS. 1, 2 and 3); and then after a short delay to the global data bus GDB, GDB-, in single ended form, with bus line GDB carrying bits 0 and 2, and bus line GDB- carrying bits 1 and 3.

With reference to the timing diagram for read operations illustrated in FIG. 9, during the first clock cycle CLK1, data (D1) is sensed from a selected memory cell, driven onto the local data bus DB_B0 and is amplified in the local sense amplifier RSAMP_B0. During the second clock cycle CLK2, the local data bus sense amplifier RSAMP_B0 drives the D1 data onto the global data bus pair GDB, GDB- in response to the drive signal DRVEN_B0. When the GDBA_EN- signal is brought low, the D1 data is sensed and latched in the global data bus sense amplifier. Meanwhile, during the same second clock cycle CLK2, another data D2 is sensed from another selected memory cell, driven onto the other local data bus DB_B1, and is then amplified in the associated local data bus sense amplifier RSAMP_B1.

During the third clock cycle CLK3, the D1 data is clocked through an output buffer (not shown) to a data pin DQ, and is then latched in a DQ driver of the output buffer. The global sense amplifier is then released so that it can accept the next data in the pipe D2. At the same time, D2 is driven onto the global data bus pair GDB, GDB-. The global sense amplifier then amplifies and latches the D2 data.

If the read operation continues, a next data D3 would then be sensed locally from yet another selected memory cell and would be driven onto the local data bus DB_B0, and amplified in the RSAMP_B0, etc. The global data path would then be fed alternately from the B0 and B1 local data paths.

During the fourth clock cycle CLK4, the D2 data is clocked through the output buffer to the DQ pin and is then latched in the output driver of the output buffer. The global sense amplifier is released once again to accept the next data if necessary.

Thus the two branches of the local data path operate at half the frequency of that of the global data path. This allows for new column addresses to be accepted on every clock cycle.

A person understanding this invention may now design alternate embodiments and enhancements using the principles described herein. For example, the invention can be used in memories other than in SDRAMs or in other semiconductor devices having a global data bus and a local data bus pair. All such embodiments and enhancements are considered to be within the spirit and scope of this invention as defined in the claims appended hereto.

We claim:

1. A method of operating data paths in a semiconductor device having a global data path and a local data path comprising:

(a) coupling data received from a data input node in sequence alternately to each of a global data bus and its complement at one half of a system clock frequency, wherein each successive bit of data received at the data input node is alternately channeled to one of the global data bus and its complement on a per-bit basis;

(b) alternately driving data from each of the global data bus and its complement onto a respective complementary local data bus pair of a plurality of local data bus pairs differentially at one half of the system clock frequency, and (c) writing the data from the respective complementary local data bus pair to selected memory cells.

2. A method as defined in claim 1 further comprising:

(d) sensing data stored in selected memory cells;

(e) coupling the sensed data to a respective local data bus pair of a plurality of complementary local data bus pairs of at one half of the system clock frequency;

(f) amplifying and sequentially applying the data from each of the plurality of complementary local data bus pairs to a respective global data bus and its complement at the full system clock frequency; and (g) further amplifying the data from the global data bus and its complement, and further applying the amplified data to an output buffer for subsequent coupling to an output pin at the full system clock frequency.

3. A method as defined in claim 2 including disabling at least step (e) during the sequence (a) to (c).

4. A method as defined in claim 1 in which the semiconductor device is a synchronous dynamic random access memory.

5. A method for inputting and outputting data to and from a semiconductor storage device having data storage cells, a bi-directional complementary global data bus pair and at least two complementary local data bus pairs, comprising the following steps:

(a) receiving input data from a data input node at a full system clock frequency;

(b) coupling the input data on alternate cycles of a system clock to each global data bus of the bi-directional complementary global data bus pair in alternating succession;

(c) selectively converting the input data from one global data bus of the bi-directional complementary global data bus pair into differential input data to be applied to a corresponding pair of the at least two complementary local data bus pairs during one cycle of the system clock;

(d) enabling a first group of local access devices to transfer the input data from one of the local data bus pairs to a first selected storage location;

(e) selectively converting the input data from the other global data bus of the bi-directional complementary global data bus pair into differential input data to be applied to a corresponding other of the at least two complementary local data bus pairs during a subsequent cycle of the system clock;

(f) enabling a second group of local access devices to transfer the input data from the other of the at least two local complementary local data bus pairs to a second selected storage location;

whereby input data accepted into the semiconductor device at the system clock frequency is alternately channeled into two separate complementary local data bus pairs via the bi-directional complementary global data bus pair operating at one half the system clock frequency in a single ended manner.

6. A method as defined in claim 5 further comprising:

(g) sensing data stored in a selected storage cell;

(h) differentially applying the sensed data on alternate cycles of the system clock to either of the at least two complementary local data bus pairs;

(i) amplifying and sequentially applying the data from each of the at least two complementary local data buses to the bi-directional complementary global data bus pair at the full system clock frequency; and (j) further amplifying the data from the global data bus, and further applying the amplified data to an output buffer for subsequent coupling to an output pin at the full system clock frequency;

whereby the global data bus pair carries in one direction successive words of write data in single ended form at one half of the system clock frequency, and carries in another direction successive words of read data in differential form at the full system clock frequency.

7. A method for operating a bi-directional global data path in a synchronous random access memory having dual local data paths for accessing data on alternate cycles of a system clock comprising the following steps:

(a) writing data to the memory by operating global data buses of the bi-directional global data path in a single ended manner with separate data on each global data bus of a complementary global data bus pair being channeled to either one or the other of the dual local data paths on alternate cycles of the system clock;

(b) reading data from the memory by operating global data buses of the bi-directional global data path in a differential manner with differentially sensed and amplified local data being applied to the global data buses on every cycle of the system clock.

* * * * *